United States Patent
Lesso

(10) Patent No.: US 7,667,508 B2
(45) Date of Patent: Feb. 23, 2010

(54) FREQUENCY SYNTHESIZER

(75) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 97 days.

(21) Appl. No.: 12/219,074

(22) Filed: Jul. 15, 2008

(65) Prior Publication Data
US 2009/0033382 A1    Feb. 5, 2009

(30) Foreign Application Priority Data
Jul. 31, 2007    (GB)    ................................. 0714890.1

(51) Int. Cl.
     *H03L 7/06*      (2006.01)
(52) U.S. Cl. ...................... 327/156; 327/147
(58) Field of Classification Search ......... 327/105–107, 327/146, 147, 154–156, 159
See application file for complete search history.

(56) References Cited

U.S. PATENT DOCUMENTS

| | | | | |
|---|---|---|---|---|
| 5,638,010 A * | 6/1997 | Adams | ........................ | 327/105 |
| 6,198,353 B1 * | 3/2001 | Janesch et al. | ................ | 331/16 |
| 6,825,729 B2 * | 11/2004 | Splett | ........................... | 331/16 |
| 7,355,462 B1 * | 4/2008 | Wong et al. | ................. | 327/156 |
| 2004/0233086 A1 | 11/2004 | Kiss et al. | | |

FOREIGN PATENT DOCUMENTS

WO     WO 03/079553 A1    9/2003

* cited by examiner

*Primary Examiner*—Hai L Nguyen
(74) *Attorney, Agent, or Firm*—Dickstein Shapiro LLP

(57) ABSTRACT

A circuit for receiving an input signal and generating an output signal, the input signal having a first frequency, the output signal having a second frequency. The circuit comprises a forward branch for generating the output signal and a return branch for feeding back the output signal. The return branch comprises a frequency divider for receiving the output signal, for dividing the frequency of the output signal by a factor, and for outputting a modified output signal. The forward branch comprises a detector for comparing the input signal and the modified output signal and outputting a comparison signal indicative of the comparison; a word-length reduction circuit for reducing the number of bits of the comparison signal, thereby generating a reduced-length comparison signal; a digital-to-analog converter for converting the reduced-length comparison signal to analog, thereby generating an analog signal; and an oscillator, controlled by said analog signal. By reducing the word length of the input to the digital-to-analog converter, the digital-to-analog converter may be greatly simplified.

26 Claims, 5 Drawing Sheets

US 7,667,508 B2

FREQUENCY SYNTHESIZER

BACKGROUND OF THE INVENTION

1. Field of the Invention

The present invention relates generally to frequency synthesis and particularly, but not exclusively, relates to frequency- and phase-locked loops.

2. Description of the Related Art

Frequency-locked loops, or alternatively phase-locked loops (FLLs and PLLs respectively), are blocks that perform the function shown in FIG. 1. That is, an input signal at a fixed first frequency $F_{in}$ is supplied to the FLL 10, and the FLL outputs a signal at a fixed second frequency $F_{out}$ that is not equal to $F_{in}$. This general principle is known as frequency synthesis.

It is advantageous to realize as much of the FLL as possible in digital, due to the benefits that are inherent with digital processing (i.e. cheaper, smaller die area, rapid testability, etc).

FIG. 2 shows an implementation of an FLL 20. A digital signal having a frequency $F_{in}$ is input to a frequency detector 22. The frequency detector 22 detects the frequency of the input signal, compares it with the frequency of a fed-back signal, and outputs a further digital signal that is indicative of the difference in the two frequencies. This signal is input to a loop filter 24 which has an integrating function, and outputs a digital integrated signal. In the majority of FLLs, the digital integrated signal preferably has a high resolution such that the FLL works accurately. Signals of the order of 20 bits or more are typical.

The integrated signal is input to a DAC 26, which converts it to an analog signal which controls a voltage-controlled oscillator 28 (VCO). The frequency of the output signal from the VCO 28 is controlled by its input signal. A high input signal leads to a high-frequency output signal, and vice versa. The signal output from the VCO 28 is fed to a ÷N block 29. The frequency $F_{out}$ of the output signal is divided by a factor N, which is chosen by the designer of the system, and the signal containing this divided frequency is fed back to the frequency detector 22. In this way the system converges to an output signal with a frequency of $F_{out}=N \times F_{in}$.

As aforementioned, the output of the loop filter 24 must have a high resolution in order for the DAC to operate correctly, of the order of 20 bits. However, designing a 20-bit DAC is extremely difficult.

SUMMARY OF THE INVENTION

According to a first embodiment of the present invention there is provided a circuit for receiving an input signal and generating an output signal, the input signal having a first frequency, the output signal having a second frequency. The circuit comprises a forward branch for generating the output signal and a return branch for feeding back the output signal. The return branch comprises a frequency divider for receiving the output signal, for dividing the frequency of the output signal by a factor, and for outputting a modified output signal. The forward branch comprises a detector for comparing the input signal and the modified output signal and outputting a comparison signal indicative of said comparison; a word-length reduction circuit for reducing the number of bits of said comparison signal, thereby generating a reduced-length comparison signal; a digital-to-analog converter for converting said reduced-length comparison signal to analog, thereby generating an analog signal; and an oscillator, controlled by said analog signal.

According to a second embodiment of the present invention there is provided a method for receiving an input signal having a first frequency and generating an output signal having a second frequency. The method comprises the steps of receiving the input signal having the first frequency; comparing the input signal and a modified output signal, and outputting a comparison signal indicative of said comparison; reducing the number of bits of said comparison signal, thereby generating a reduced-length comparison signal; converting said reduced-length comparison signal to an analog signal; controlling a voltage-controlled oscillator on the basis of said analog signal, thereby generating the output signal having the second frequency; and dividing the second frequency by a factor, thereby generating said modified output signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE PREFERRED EMBODIMENT

The following description is based on frequency-locked loops (FLLs). However, the present invention is equally applicable to phase-locked loops (PLLs). A person skilled in the art will readily understand how the embodiments described hereinafter may be adapted to PLLs: for example, the blocks described as "frequency detectors" may be easily replaced with "phase detectors". Further minor modifications may be necessary, but the invention as described hereinafter applies equally to FLLs and PLLs, and as such the invention is not to be considered as limited to the specific examples described.

Figure 1:
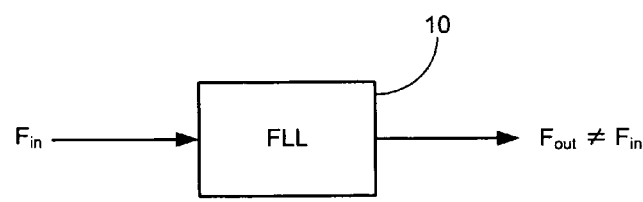
FIG. 1 is a block diagram of a FLL.
Figure 2:
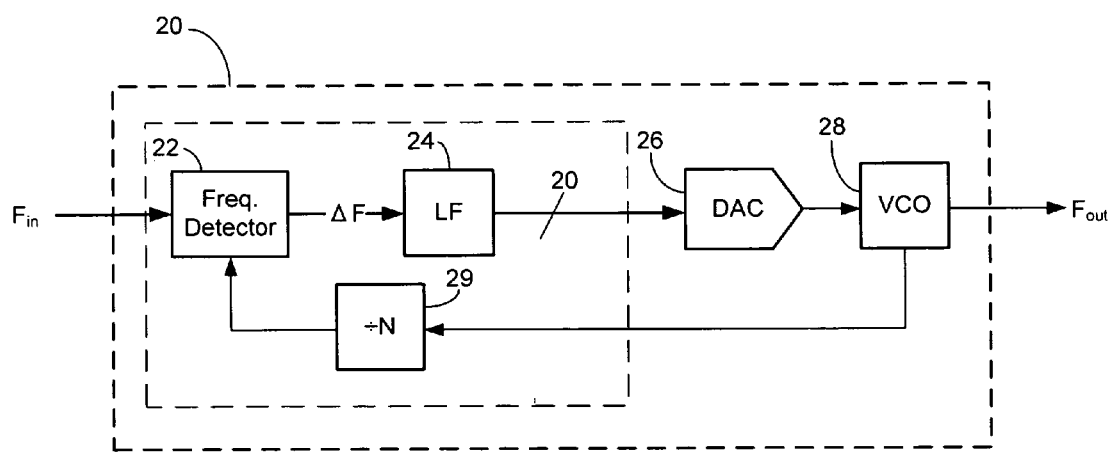
FIG. 2 is a schematic diagram of an implementation of a FLL.
Figure 3:
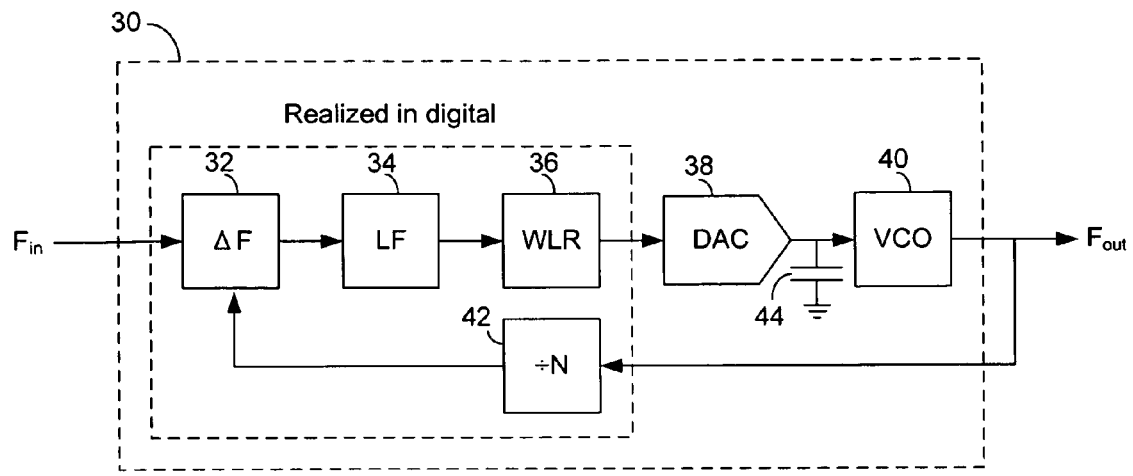
FIG. 3 is a schematic diagram of an alternative implementation of a FLL.

FIG. 3 is a schematic diagram of a FLL 30.

A digital signal having a frequency $F_{in}$ is input to a frequency detector 32. The frequency detector 32 detects the frequency of the input signal, compares it with the frequency of a fed-back signal, and outputs a signal that is indicative of the difference in the two frequencies. This signal is input to a loop filter 34, which has an integrating function. In other embodiments, alternative or additional filtering components to the loop filter 34 may be used. The only requirement is that the component has an integrating function. The loop filter 34 outputs an integrated signal with a high number of bits, as before. However, this signal is input to a word-length reduction (WLR) block 36. The WLR block 36 outputs a signal to a digital-to-analog converter (DAC) 38, which converts it to analog. The analog signal is then used to control a VCO 40, and this outputs a signal at a frequency $F_{out}$. The signal output from the VCO 40 is sampled, and fed to a ÷N block 42. The frequency of the output signal $F_{out}$ is divided by a factor N, which is chosen by the designer of the system, and this divided frequency signal is fed back to the frequency detector 32. In this way the system converges to an output signal with a frequency of $F_{out}=N \times F_{in}$.

The WLR block 36 operates to reduce the word length of the signal output from the loop filter 34, in order to reduce the complexity of the DAC. For example, the signal input to the WLR block 36 may be 20 bits long. The WLR block 36 may then operate to reduce this to a lower number of bits, say 5. A 5-bit DAC is much easier to design than a 20-bit DAC, and therefore the word-length reduction results in a large saving in terms of the complexity of the system.

Many different forms of word-length reduction will be known to those skilled in the art, and therefore the WLR block 36 may take one of a number of forms. For example, the word length reduction may be a truncation, with the least significant bits (LSBs) being removed from the signal. This is the most simple method of word length reduction, and therefore results in the greatest savings in terms of complexity; however, a truncated signal will in general output a signal that is, on average, lower than the input signal (approximating all the removed LSBs to zero, when in fact they will always be zero or greater).

The method of truncation may be improved by adding dither to the signal. Dither is a random noise signal added to the input signal prior to truncation, such that when the signal is truncated there is a chance the signal may be approximated to a higher significant bit. On average, a truncated signal will be a more accurate representation of its input signal if dither is added prior to truncation.

Figure 4:
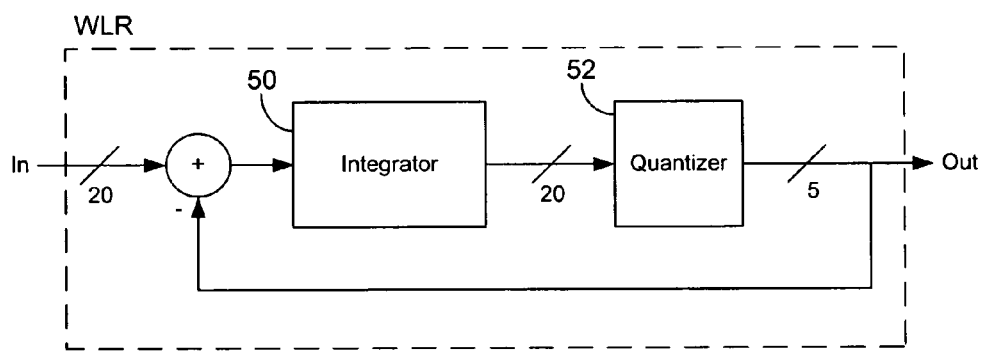
FIG. 4 is a schematic diagram of a sigma-delta modulator.

An advantageous form of word length reduction is sigma-delta modulation. Sigma-delta modulators (SDMs) operate according to the principle shown in FIG. 4. In the example shown, a 20-bit input is fed to an integrator 50 (i.e. "sigma"), and the output from the integrator fed to a quantizer 52. The quantizer output is output from the system, but also fed back and subtracted from the input signal (i.e. "delta"). This difference is fed to the integrator, and the loop continues in this way, summing the differences, outputting the quantized sum, and subtracting the output from the input. Thus output from the SDM is a stream of 1 s and 0 s (in the one-bit output case). However, this output averages over time to the input signal to a very high degree of accuracy. Thus, although the instantaneous output of the SDM is inaccurate, the average output of the SDM is accurate.

In the FLL 30, the output from the WLR block 36 is averaged by the low-pass filter effect, which is typical, of the DAC 38 so as to avoid, or at least mitigate, the modulation of the frequency of the output signal $F_{out}$. Furthermore, an optional extra low pass filter may be added after the DAC 38 to increase this "averaging" behaviour and stabilize the loop. For example, a capacitor 44 may be added as shown in FIG. 3 or alternatively an RC network. The capacitor 44 is connected at one terminal between the DAC 38 and the VCO 40, and at the other terminal to ground. In this way, the average value of the WLR output is taken rather than the instantaneous value.

Figure 5A:
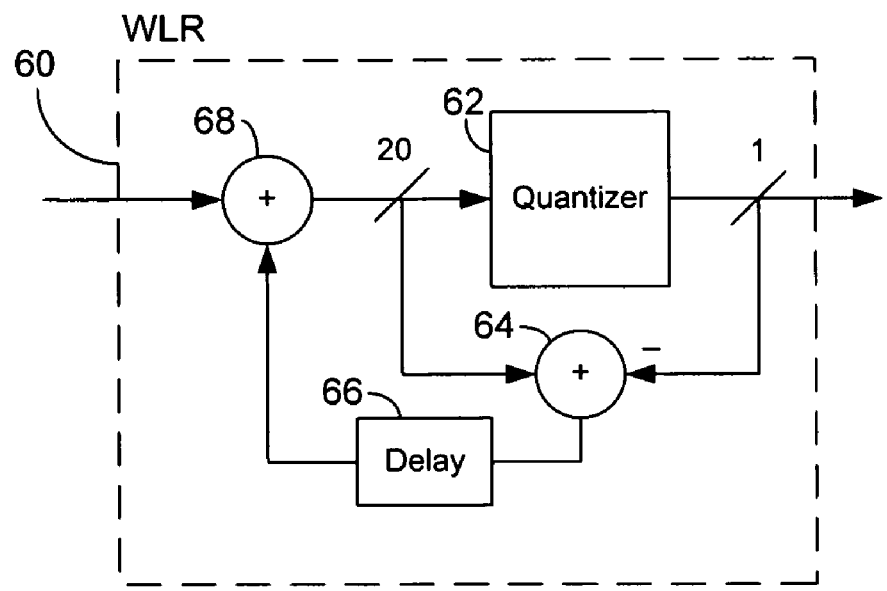
FIG. 5a is a schematic diagram of a noise shaper.

A similar technique to sigma-delta modulation is noise shaping. FIG. 5*a* shows a schematic diagram of a noise shaper 60. In the example shown, a 20-bit input signal is quantized to a 1-bit output signal by a quantizer 62. The quantization error, i.e. the bits that have been discarded as a result of the quantization, is determined by subtracting the output signal from the input signal in a subtracting element 64. The quantization error is fed back through a delay 66 to an adding element 68, where it is added to the input signal.

Figure 5B:
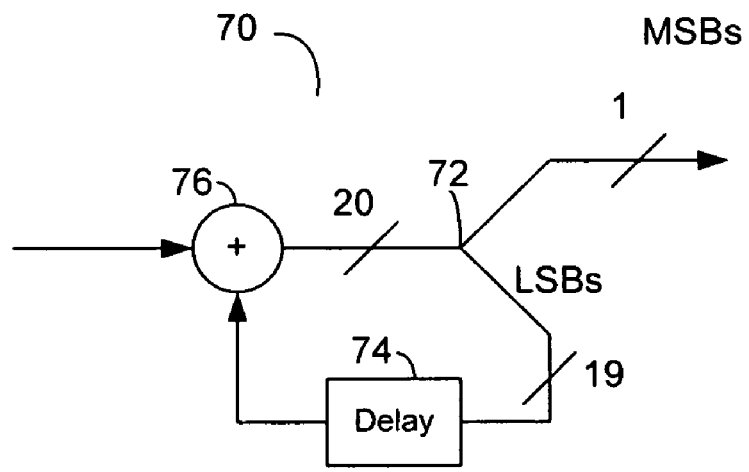
FIG. 5b is a schematic diagram of an alternative realization of a noise shaper.

FIG. 5*b* shows an alternative realization of a noise shaper 70, using a split 72. In the 1-bit example shown, the split 72 takes the MSB and outputs it. The remaining LSBs are fed back through a delay 74 to an adding element which adds the LSBs to the input signal. Thus the noise shaper 70 in FIG. 5*b* is exactly equivalent to the noise shaper 60 in FIG. 5*a*.

In descriptions of a noise shaper hereinafter, the delay element is shown in the forward branch rather than the return branch. This is because it may be advantageous in certain circumstances to delay the output signal so as, for example, to allow resynchronization after an addition. Therefore, rather than provide two delay elements, one in each branch after the split, it is more efficient to provide a single delay element in the forward branch prior to the split so that both signals are delayed by the same delay element.

Figure 6:
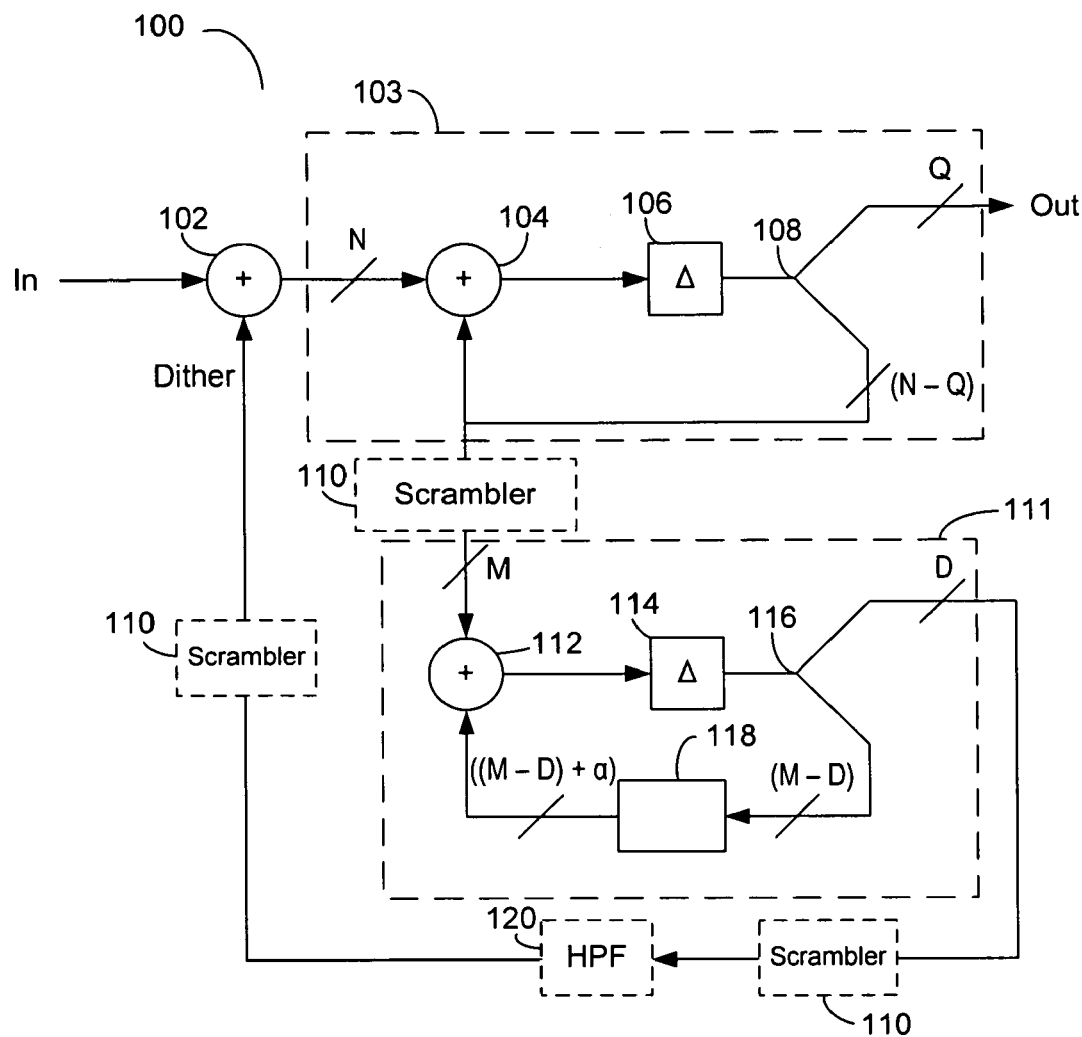
FIG. 6 is a schematic diagram of a noise shaper with chaotic dither.

FIG. 6 shows a further example of a word length reduction circuit 100 that may be used as the WLR block 36 in the FLL 30.

In the word length reduction circuit 100, dither is added to an input signal to generate a modified input signal. The modified input signal is then input to a first-order noise shaper 103 largely as described in FIG. 5*b*. The first-order noise shaper 103 generates a quantized output signal and a quantization error signal. Advantageously, the quantization error signal of the first-order noise shaper 103 is used to create the dither signal (Dither) that is added to the input signal (In). This is achieved by inputting the quantization error signal to a second noise shaper 111 that has an unstable feedback loop. The unstable feedback loop has the effect of randomizing the output signal of the second noise shaper 111. The randomized output signal of the second noise shaper 111 can then be used to dither the input signal.

Dither is added to the input signal in an adding element 102, to generate an N-bit modified input signal. The modified input signal is added to a fed back signal in a further adding element 104. The output of the adding element 104 is fed through a delay element 106, before being separated into Q MSBs and (N−Q) LSBs at a split 108. The Q MSBs are output from the word length reduction circuit 100 as the quantized output signal (i.e. reduced word length). The (N−Q) LSBs are fed back and added to the modified input signal in the adding element 104. Hereinafter, the (N−Q) LSBs are referred to as the "quantization error".

In order to minimize this effect, optionally the quantization error signal or the dither or any signal in between may be scrambled in a scrambler 110. FIG. 6 shows three possible arrangements for the scrambler 110: scrambling the quantization error signal output from the first-order noise shaper 103; scrambling the output of the second-order noise shaper 111; and scrambling the dither signal just before it is added to the input signal in the adder 102. However, further positions for the scrambler 110 may be thought of by one skilled in the art without departing from the scope of the invention.

The purpose of this step is to introduce a random signal such as noise, white noise for example, such that the dither signal has even less dependence on the input signal. The technique of introducing noise into a signal is also known as "spectral conditioning". Alternative methods of scrambling include introducing one or more non-linear filters or providing crossover switches that reverse the bit significance. Further, one or more of these scramblers may be used in combination.

Thus an M-bit signal is input to the second noise shaper 111. If there is no noise-whitening stage, M =(N−Q) and the signal is the quantization error of the first noise shaper 103.

The M-bit signal is added to a fed-back signal in an adding element 112. The combined signal is fed through a delay element 114, and to a split 116. At the split 116 the signal is separated into D MSBs and (M−D) LSBs. The LSBs are fed back through a feedback path to the adding element 112. The feedback path contains a signal processing element 118 whose function is to make the feedback path containing it part of an unstable loop. The signal processing element 118 may be made unstable, for example, by means of a gain element, or by a delay element, or by any other non-linear element, or by a combination of these elements. The signal processing element 118 may add a number of bits a to the signal, where $\alpha=\log_2(Gain)$, for the example where the signal processing element 118 comprises a gain element.

The D MSBs are used as the dither signal added to the input signal in the adding element 102. Optionally, the D MSBs may be high-pass filtered to remove any systematic offset in the dither. For example, in the 1-bit case (i.e., D=1), as the output will be a random stream of 1 s and 0 s, the average output of the second noise shaper 111 is ½. Were this signal added directly as the dither signal to the input, the average output of the circuit 100 would be increased by ½ also. A high-pass filter 120 can be simply designed by one skilled in the art to remove this offset. However, in systems that are DC signal tolerant, the high-pass filter 120 may be dispensed with.

Figure 7:
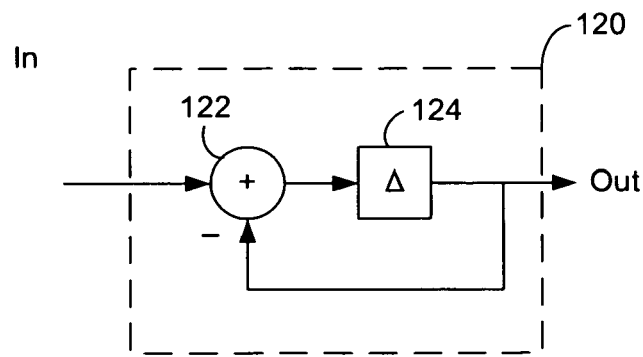
FIG. 7 is a schematic diagram of an exemplary high pass filter.

An example of a high-pass filter 120 for use in the word length reduction circuit 100 is shown schematically in FIG. 7. The input signal is fed to a subtracting element 122 where it is added to an inverted fed-back signal. The combined signal is then delayed in a delay element 124 and fed back to the subtracting element 122. Thus, the possible outputs of the high-pass filter 120 are increased to −1, 0 and +1, and the average output reduced to 0.

There are many alternative embodiments of the word length reduction circuit 100 that one skilled in the art may think of without departing from the scope of the invention. For example, the optional nature of the scrambler 110 and the high-pass filter 120 has already been discussed.

The first noise shaper 103 may be replaced with an alternative word reduction circuit or block, such as a truncation, or a sigma-delta modulator. Such circuits by definition generate a quantized output and an associated quantization error, and therefore the second noise shaper 111 can still be used in the same manner to create the dither signal.

Further, the circuit 100 as described with reference to FIG. 6 uses the most significant bits of the second noise shaper 111 to generate the dither signal. However, as the unstable feedback loop combines with the input signal to generate a random combined signal, the entire signal in the forward branch of the noise shaper 111 is random. Therefore, any of the bits in the combined signal may be used to generate the dither signal. Further, the split 116 may not separate the signal into most- and least-significant bits, but rather may feed the whole signal back through the unstable feedback loop.

Figure 8:
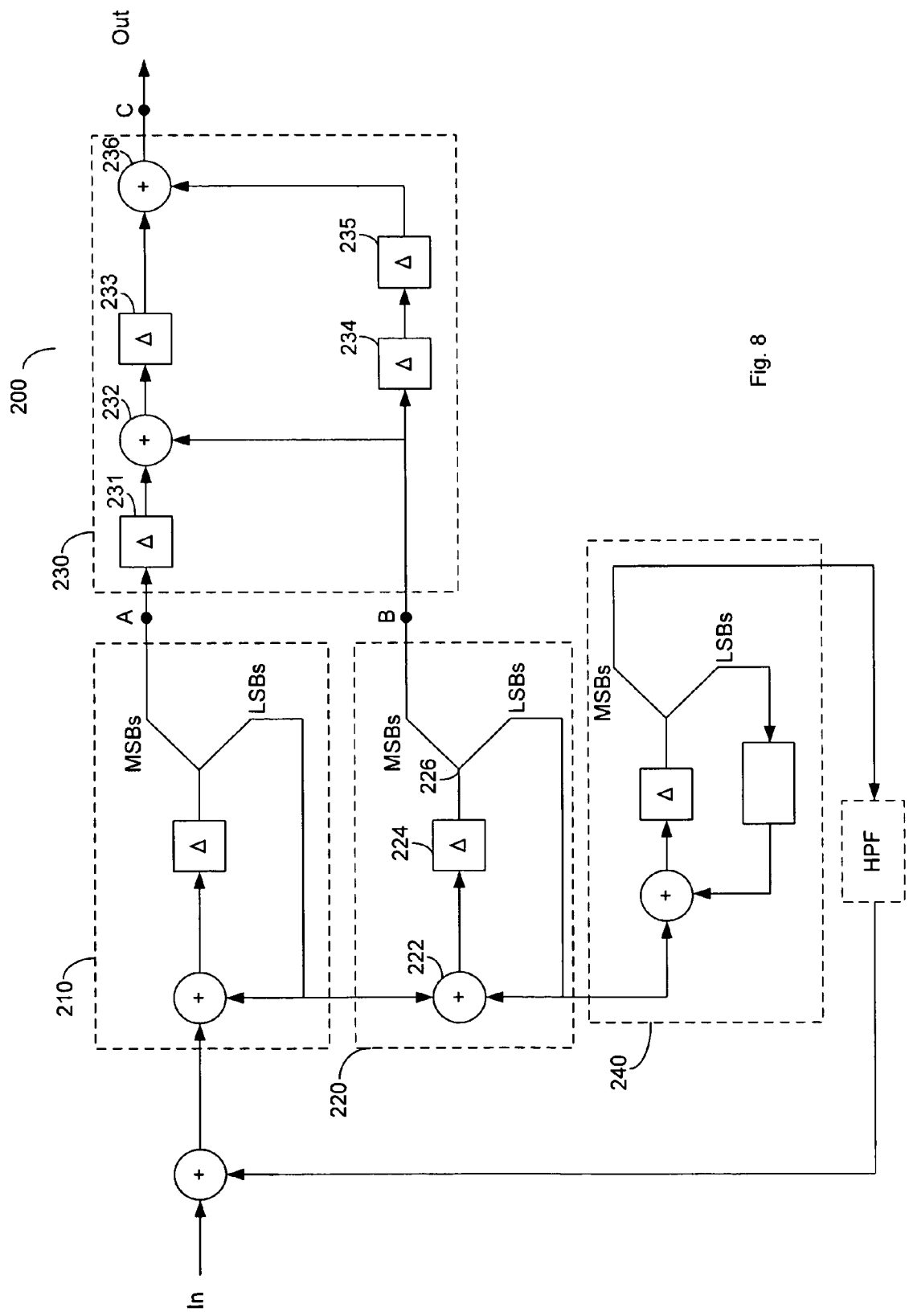
FIG. 8 is a schematic diagram of a second-order noise shaper with chaotic dither.

FIG. 8 shows a second-order noise shaper 200.

The second-order noise shaper 200 comprises two first order noise shapers 210, 220, an error recombination block 230 to recombine the output signals of the two first-order noise shapers 210, 220, and a further noise shaper 240 with an unstable feedback loop to create the dither signal.

The first noise shaper 210 operates as described earlier with respect to FIG. 5b, and will not be described in further detail. A modified (i.e. dithered) input signal is quantized and the quantized output and quantization error are output from the noise shaper 210. Thus, the signal at the point labelled A in FIG. 8 is the core signal minus the quantization error.

The quantization error is output from the first noise shaper 210 to the second noise shaper 220. The quantization error is added to a fed-back signal in an adding element 222. The combined signal is fed through a delay element 224 to a split 226 which separates the signal into one or more MSBs and the remaining LSBs. The MSBs are output from the second noise shaper 220, and the LSBs fed back to the adding element 222. Therefore, the signal at the point labelled B in FIG. 8 is the quantized first-order quantization error: the first-order error minus a second-order error.

The second-order error may then be used as the input to the noise shaper 240, with a structure similar to the noise shaper 111, that has unstable feedback in order to generate the dither signal as described previously with respect to FIG. 6.

The outputs of the two first-order noise shapers 210, 220 are combined in the error recombination block 230 in order to output a signal with reduced quantization error.

The output of the first noise shaper 210 is first delayed by a delay element 231. The delayed output of the first noise shaper 210 is then added to the output of the second noise shaper 220 in an adding element 232. This combined output is then fed to a further delay element 233.

The output of the second noise shaper 220 is then delayed by two delay elements 234, 235. The delayed output of the second noise shaper 220 is then added to the delayed combined output of the delay element 233 in a further adding element 236. The output of the adding element 236 is the core signal plus the second-order quantization error; the first-order quantization error has been corrected for.

Throughout all of the above description, delay elements are considered to have the same delay effect on a signal. However, a person skilled in the art would fully appreciate that the periods of delay could be varied from delay element to delay element, as long as the signals were synchronized correctly.

The frequency-locked loop 30 is preferably incorporated in an integrated circuit. For example, the integrated circuit may be part of an audio and/or video system, such as an MP3 player, a mobile phone, a camera or a satellite navigation system, and the system can be portable (such as a battery-powered handheld system) or can be mains-powered (such as a hi-fi system or a television receiver) or can be an in-car, in-train, or in-plane entertainment system.

The skilled person will recognise that the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analog array or similar device in order to configure analog/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

What is claimed is:

1. A circuit for receiving an input signal and generating an output signal, the input signal having a first frequency, the output signal having a second frequency, said circuit comprising:
    a forward branch for generating the output signal; and
    a return branch for feeding back the output signal,
    wherein the return branch comprises:
        a frequency divider for receiving the output signal, for dividing the frequency of the output signal by a factor, and for outputting a modified output signal;
    wherein the forward branch comprises:
        a detector for comparing the input signal and the modified output signal and outputting a comparison signal indicative of said comparison;
        a word-length reduction circuit for reducing the number of bits of said comparison signal, thereby generating a reduced-length comparison signal;
        a digital-to-analog converter for converting said reduced-length comparison signal to analog, thereby generating an analog signal; and
        an oscillator, controlled by said analog signal.

2. The circuit as claimed in claim 1, wherein the word-length reduction circuit comprises:
    a truncation block for truncating the comparison signal.

3. The circuit as claimed in claim 2, wherein the word-length reduction circuit further comprises:
    a dither block for adding dither to the comparison signal prior to truncation.

4. The circuit as claimed in claim 1, wherein the word-length reduction circuit comprises:
    a sigma-delta modulator.

5. The circuit as claimed in claim 1, wherein the word-length reduction circuit comprises:
    an input, for receiving the comparison signal;
    a first word length reduction block, for receiving a modified input signal having a respective first number of bits, for generating an output signal having a respective second number of bits, the respective second number of bits being smaller than the respective first number of bits, and for generating an error signal; and
    a second word length reduction block, for receiving the error signal of the first word length reduction block as a respective input signal having a respective first number of bits, and for generating an output signal having a respective second number of bits, the respective second number of bits being smaller than the respective first number of bits, the second word length reduction block comprising an unstable feedback loop such that the output signal is randomized; and
    a first adder, connected to receive the output signal of the second word length reduction block and connected to receive the input signal, in order to generate the modified input signal.

6. The circuit as claimed in claim 1, further comprising an integrator for receiving the comparison signal and outputting an integrated comparison signal to the word length reduction circuit.

7. The circuit as claimed in claim 6, wherein the integrator is a loop filter.

8. The circuit as claimed in claim 1, further comprising: a low pass filter for receiving the analog signal from the digital-to-analog converter and outputting a filtered analog signal to the oscillator.

9. The circuit as claimed in claim 8, wherein the low-pass filter comprises a capacitor connected at one terminal between the digital-to-analog converter and the oscillator, and at the other terminal to ground.

10. The circuit as claimed in claim 1, wherein said detector is adapted to detect and compare the respective phases of the input signal and the modified output signal.

11. The circuit as claimed in claim 1, wherein said detector is adapted to detect and compare the respective frequencies of the input signal and the modified output signal.

12. An integrated circuit, comprising the circuit as claimed in claim 1.

13. An audio system, comprising the integrated circuit as claimed in claim 12.

14. The audio system as claimed in claim 13, wherein the audio system is a portable device.

15. The audio system as claimed in claim 13, wherein the audio system is a mains-powered device.

16. The audio system as claimed in claim 13, wherein the audio system is an in-car, in-train, or in-plane entertainment system.

17. A video system, comprising the integrated circuit as claimed in claim 12.

18. The video system as claimed in claim 17, wherein the video system is a portable device.

19. The video system as claimed in claim 17, wherein the video system is a mains-powered device.

20. The video system as claimed in claim 17, wherein the video system is an in-car, in-train, or in-plane entertainment system.

21. A method for receiving an input signal having a first frequency and generating an output signal having a second frequency, said method comprising:
    receiving the input signal having the first frequency;
    comparing the input signal and a modified output signal, and outputting a comparison signal indicative of said comparison;
    reducing the number of bits of said comparison signal, thereby generating a reduced-length comparison signal;
    converting said reduced-length comparison signal to an analog signal;
    controlling a voltage-controlled oscillator on the basis of said analog signal, thereby generating the output signal having the second frequency; and
    dividing the second frequency by a factor, thereby generating said modified output signal.

22. The method as claimed in claim 21, wherein said reducing step comprises the substep of truncating the comparison signal.

23. The method as claimed in claim 22, wherein said reducing step further comprises the substep of adding dither to the comparison signal prior to truncation.

24. The method as claimed in claim 21, wherein said reducing step comprises the substep of using a sigma-delta modulator.

25. The method as claimed in claim 21, further comprising: integrating said comparison signal.

26. The method as claimed in claim 21, further comprising: low-pass filtering the analog signal.

* * * * *